United States Patent [19]

Suettinger et al.

[11] Patent Number: 5,157,259
[45] Date of Patent: Oct. 20, 1992

[54] MEASURING METHOD AND MEASURING ARRANGEMENT FOR DETERMINING THE ORIENTATION RATIO OF FLEXIBLE MAGNETIC RECORDING MEDIA

[75] Inventors: Rudolf Suettinger, Heidelberg; Ursula Klein, Limburgerhof, both of Fed. Rep. of Germany

[73] Assignee: BASF Aktiengesellschaft, Ludwigshafen, Fed. Rep. of Germany

[21] Appl. No.: 677,893

[22] Filed: Apr. 1, 1991

[30] Foreign Application Priority Data

Apr. 14, 1990 [DE] Fed. Rep. of Germany ....... 4012240

[51] Int. Cl.$^5$ ................................................ G01T 4/00
[52] U.S. Cl. .................... 250/341; 250/358.1; 356/364
[58] Field of Search ............... 250/341, 338.1, 359.1, 250/358.1; 356/364, 370

[56] References Cited

U.S. PATENT DOCUMENTS 4,280,918 7/1981 Homola et al. .................. 252/62.51
4,654,529 3/1987 Boulan et al. ..................... 356/364

OTHER PUBLICATIONS

"Versatile and Sensitive Vibrating-Sample Magnetometer", Foner The Review of Scientific Instruments, vol. 30, No. 7 548-557.

*Primary Examiner*—Carolyn E. Fields
*Assistant Examiner*—Drew A. Dunn
*Attorney, Agent, or Firm*—Keil & Weinkauf

[57] ABSTRACT

The orientation ratio ($R_f$) of a magnetic layer is defined as the ratio of the magnetizations in the playing direction and the crosswise direction. Assuming that the magnetic layer has anisotropy with respect to the transmittance of infrared light, owing to the orientation of the magnetic pigments, infrared light from a source (IR) is passed through a polarizer (P). The linearly polarized light strikes the magnetic recording medium (M), which is conveyed over a transparent support (T). The support and polarizer are adjusted with respect to one another so that a detector (D) is exposed to maximum light intensity, which is proportional to the orientation ratio ($R_f$).

5 Claims, 2 Drawing Sheets

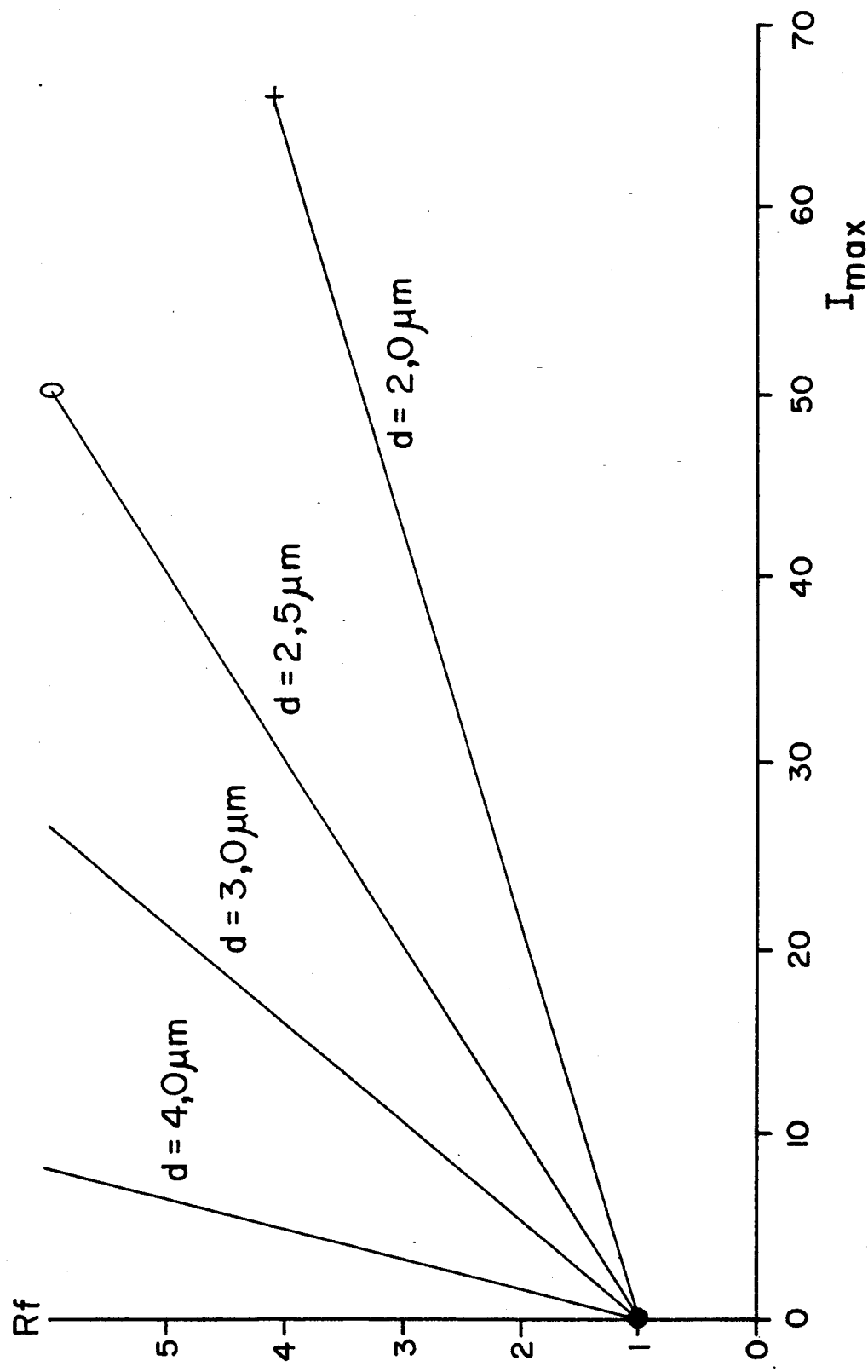

MEASURING METHOD AND MEASURING ARRANGEMENT FOR DETERMINING THE ORIENTATION RATIO OF FLEXIBLE MAGNETIC RECORDING MEDIA

The present invention relates to a measuring method and a measuring arrangement for determining the orientation ratio of the magnetic layer of flexible magnetic recording media.

The orientation ratio has been determined to date by measuring the magnetization (residual induction) in the playing direction and that in the crosswise direction, for example with the aid of a vibrating sample magnetometer described in the technical literature (S. Foner: Review Science Instruments, Jul. 1959, Vol. 30, No. 7, pages 548–557). The orientation ratio is obtained as a ratio of the two measurements.

It is disadvantageous that samples have to be cut from the magnetic recording medium in order to carry out the measurements and that the measurement therefore cannot be performed continuously with the manufacturing process, i.e. on-line.

It is an object of the present invention to provide a measuring method and a measuring arrangement for determining the orientation ratio of flexible magnetic recording media, which method and arrangement permit measurement on the magnetic recording medium without sample preparation.

We have found that the object relating to the measuring method is achieved if the magnetic recording medium is exposed to linearly polarized infrared light, in particular having a wavelength of from 2.5 to 25 μm, the intensity of that part of the light which is transmitted by the magnetic recording medium is measured and the orientation ratio is determined from this with the aid of a mathematical relationship or a graph as a function of the layer thickness, the playing direction of the magnetic recording medium and the polarized light beam being adjusted with respect to one another so that maximum intensity of the transmitted light is obtained.

We have found that the object relating to the measuring arrangement is achieved by the successive arrangement of an infrared light source, a polarizer, a support for the magnetic recording medium and an infrared light detector which is connected to an evaluation circuit including a display means, the polarizer or the support being rotatable, each in its plane.

Further details of the invention are described below with reference to an embodiment shown schematically in the drawing.

FIG. 2 shows the dependence of the orientation ratio on the intensity of the infrared light transmitted by the magnetic recording medium and on the layer thickness in the form of a graph.

Figure 1:
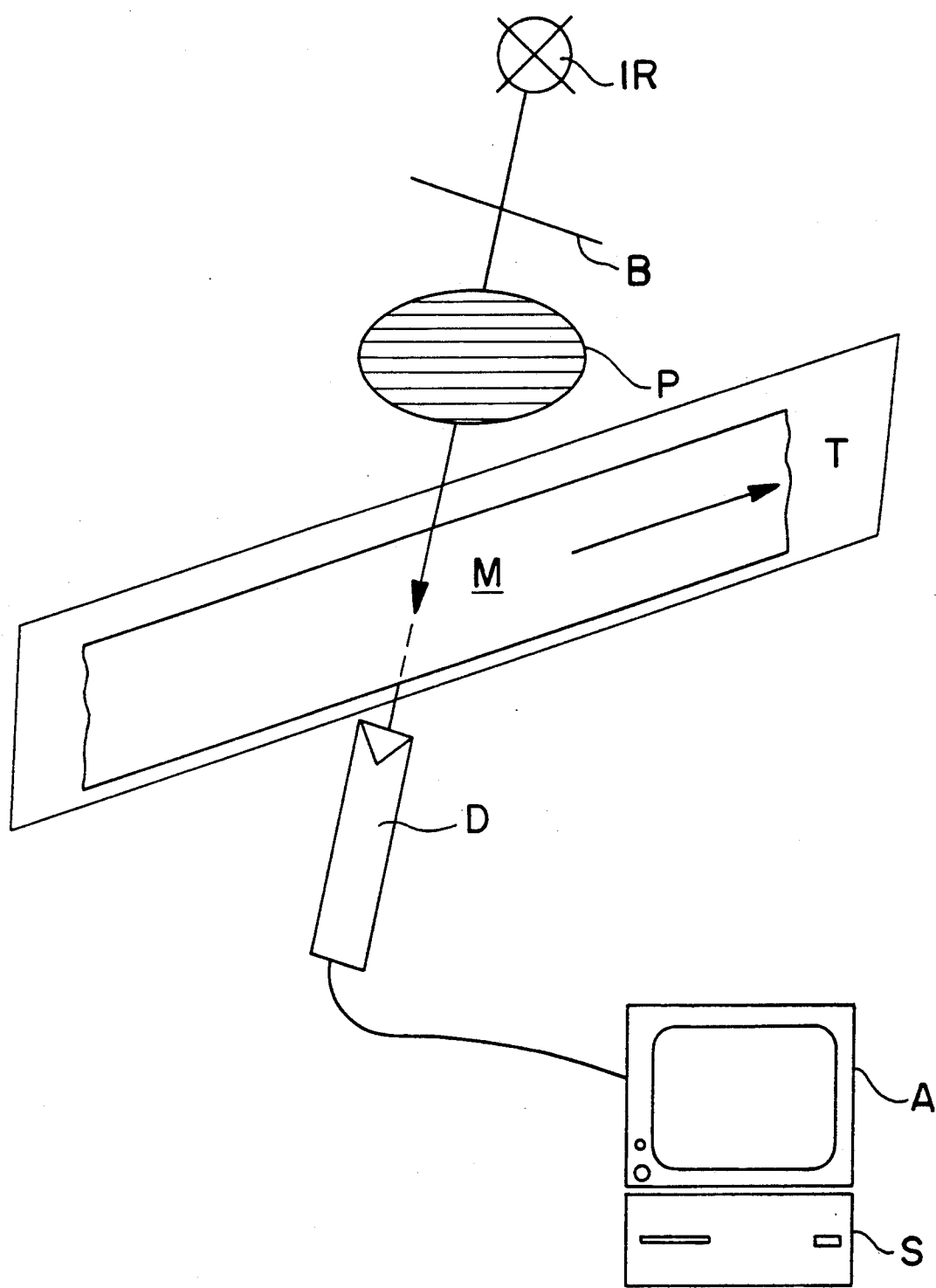
FIG. 1 shows a schematic setup of the measuring arrangement.

Starting from the observation that the magnetic layer on a flexible, transparent substrate has pronounced anisotropy with respect to the transmittance of infrared light, owing to the orientation of the magnetic pigments, in the novel measuring method the orientation ratio $R_f$ of such a magnetic recording medium is determined as a function of this infrared light-polarizing effect.

For this purpose, infrared light having a wavelength of from 2.5 to 25 μm from an infrared source IR is passed via an aperture B through an infrared polarizer P. The linearly polarized light strikes the magnetic recording medium M, which is conveyed over a transparent support T. The support or the polarizer is held so that it can be inclined, to enable the Brewster angle to be set in an advantageous manner as the angle of incidence for eliminating interference phenomena. The infrared light passing through the magnetic recording medium as a function of the layer thickness, the degree of orientation of the magnetic pigments and the position of the magnetic recording medium with respect to the plane of polarization generates, in a detector D, measuring signals which are fed to an evaluation circuit S, for example a microprocessor. The evaluation circuit is connected to a display means A, in order to permit the intensity of the detected infrared light to be read.

To obtain the maximum intensity $I_{max}$ of the transmitted light, the support T for the magnetic recording medium or the polarizer P is held rotatably in its plane.

Using the measured maximum intensity $I_{max}$, the orientation ratio $R_f$ can be determined with the aid of the mathematical relationship.

$$R_f = \frac{I_{max} + \beta_{max}}{a_{max}}. \qquad (1)$$

$a_{max}$ is a parameter which is dependent on the thickness d and the composition of the magnetic layer and is determined by the calibration relationship $I_{max} \sim R_f$.

$\beta_{max}$ is the ordinate intercept of the abovementioned calibration relationship (1).

Advantageously, the calculation of the orientation ratio $R_f$ is also formed by means of the evaluation circuit S and then displayed.

In FIG. 2, the orientation ratio $R_f$ is shown as a function of the intensity $I_{max}$ and of the magnetic layer thickness d.

The measuring method described above and the measuring arrangement for this purpose meet all preconditions for on-line measurement of the orientation ratio.

We claim:

1. A measuring method for determining the orientation ratio of the magnetic layer of flexible magnetic recording media, wherein the magnetic recording medium is exposed to linearly polarized infrared light, in particular having a wavelength of from 2.5 to 25 μm, the intensity of that part of the light which is transmitted through the magnetic recording medium is measured and the orientation ratio is determined from this with the aid of a mathematical relationship or a graph as a function of the layer thickness, the playing direction of the magnetic recording medium and the polarized light beam being adjusted with respect to one another so that maximum intensity of the transmitted light is obtained.

2. A measuring method as claimed in claim 1, wherein the polarized infrared light is directed at the Brewster angle at the magnetic recording medium.

3. A measuring arrangement for carrying out the measuring method as claimed in claim 1, comprising the successive arrangement of an infrared light source, an aperture, a polarizer comprising means for polarizing the infrared light, a support for the magnetic recording medium and an infrared light detector comprising means for detecting that part of the polarized infrared light which is transmitted through the magnetic recording medium which is connected to an evaluation circuit comprising means for determining the orientation ratio of the magnetic layer from the detector output and including a display means, the polarizer or the support being rotatable, each in its plane.

4. A measuring arrangement as claimed in claim 3, comprising means for inclining the support for the magnetic recording medium with respect to the plane of polarization.

5. A measuring arrangement as claimed in claim 3, comprising means for inclining the polarizer with respect to the plane of the support.

* * * * *